United States Patent
Lo et al.

(10) Patent No.: US 9,773,571 B2
(45) Date of Patent: Sep. 26, 2017

(54) MEMORY REPAIR REDUNDANCY WITH ARRAY CACHE REDUNDANCY

(71) Applicant: Macronix International Co., Ltd., Hsinchu (TW)

(72) Inventors: Chi Lo, Hsinchu (TW); Shuo-Nan Hung, Jhubei (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 177 days.

(21) Appl. No.: 14/572,166

(22) Filed: Dec. 16, 2014

(65) Prior Publication Data

US 2016/0170853 A1 Jun. 16, 2016

(51) Int. Cl.
*G06F 11/00* (2006.01)
*G11C 29/00* (2006.01)

(52) U.S. Cl.
CPC .............. *G11C 29/78* (2013.01); *G11C 29/76* (2013.01); *G06F 2201/85* (2013.01)

(58) Field of Classification Search
CPC .................................................. G06F 11/2094
USPC ....................................................... 714/6.22
See application file for complete search history.

(56) References Cited

U.S. PATENT DOCUMENTS

| | | | |
|---|---|---|---|
| 5,077,691 A | 12/1991 | Haddad et al. | |
| 5,126,973 A | 6/1992 | Gallia et al. | |
| 5,325,334 A | 6/1994 | Roh et al. | |
| 5,537,665 A | 7/1996 | Patel et al. | |
| 5,590,085 A | 12/1996 | Yuh et al. | |
| 5,621,691 A | 4/1997 | Park | |
| 5,732,030 A | 3/1998 | Dorney | |
| 5,812,466 A | 9/1998 | Lee et al. | |
| 5,953,270 A | 9/1999 | Kim | |
| 5,959,904 A | 9/1999 | Oh | |
| 5,999,463 A | 12/1999 | Park et al. | |
| 6,002,620 A | 12/1999 | Tran et al. | |
| 6,094,384 A | 7/2000 | Ka | |
| 6,115,300 A | 9/2000 | Massoumi et al. | |
| 6,141,268 A | 10/2000 | Chen et al. | |
| 6,205,515 B1 | 3/2001 | Huang | |
| 6,317,355 B1 | 11/2001 | Kang | |
| 6,337,816 B1 | 1/2002 | Park et al. | |
| 6,343,037 B1 | 1/2002 | Park et al. | |
| 6,445,626 B1 | 9/2002 | Hsu et al. | |

(Continued)

OTHER PUBLICATIONS

U.S. Office Action dated Jun. 6, 2014 for related U.S. Appl. No. 12/893,235, pp. 1-16.

(Continued)

*Primary Examiner* — Elmira Mehrmanesh
(74) *Attorney, Agent, or Firm* — Haynes Beffel & Wolfeld LLP

(57) ABSTRACT

An integrated circuit including a memory, an array cache, and a cache replacement store is described. The memory includes a primary array and a redundant array. The integrated circuit also includes circuitry configured to transfer data into or out of the primary array using the array cache. For defective locations in the array cache, the circuitry is configured to use the cache replacement store in the transfer of data in place of the defective locations in the array cache, and map addresses in the primary array corresponding to the defective locations in the cache array to the redundant array.

14 Claims, 10 Drawing Sheets

(56) References Cited

U.S. PATENT DOCUMENTS

| | | |
|---|---|---|
| 6,490,208 B2 | 12/2002 | Yoon |
| 6,496,425 B1 | 12/2002 | Abedifard et al. |
| 6,603,690 B1 | 8/2003 | Chen et al. |
| 6,665,221 B2 | 12/2003 | Abedifard et al. |
| 6,671,214 B2 | 12/2003 | Abedifard et al. |
| 6,674,676 B1 | 1/2004 | Hsu et al. |
| 6,915,467 B2 | 7/2005 | Pilo |
| 6,966,012 B1 | 11/2005 | Gandhi |
| 7,064,990 B1 | 6/2006 | Dawson et al. |
| 7,134,057 B1 | 11/2006 | Kaushik et al. |
| 7,149,136 B2 * | 12/2006 | Tanishima ............. G11C 29/24 365/189.05 |
| 7,251,173 B2 | 7/2007 | Lunde et al. |
| 7,570,536 B2 | 8/2009 | Chi |
| 7,738,308 B2 | 6/2010 | Afghahi et al. |
| 8,706,968 B2 * | 4/2014 | Flynn ....................... G06F 9/52 711/120 |
| 8,902,687 B2 * | 12/2014 | Hosoe ................... G11C 29/04 365/200 |
| 9,190,176 B2 * | 11/2015 | Kim ..................... G11C 29/808 |
| 2003/0133340 A1 * | 7/2003 | Lee .................... G11C 16/3454 365/200 |
| 2004/0123181 A1 | 6/2004 | Moon et al. |
| 2007/0223291 A1 * | 9/2007 | Cernea ................. G11C 29/848 365/200 |
| 2009/0180340 A1 | 7/2009 | Song et al. |
| 2010/0107004 A1 | 4/2010 | Bottelli et al. |
| 2012/0075943 A1 | 3/2012 | Chen et al. |
| 2013/0208548 A1 * | 8/2013 | Hung ................... G11C 29/808 365/189.05 |
| 2015/0121174 A1 * | 4/2015 | Nakagawa .......... G06F 11/1048 714/773 |

OTHER PUBLICATIONS

U.S. Office Action dated Oct. 10, 2013 for related U.S. Appl. No. 12/893,235, pp. 1-16.

\* cited by examiner

MEMORY REPAIR REDUNDANCY WITH ARRAY CACHE REDUNDANCY

TECHNICAL FIELD

This disclosure relates to memory redundancy.

BACKGROUND

Redundancy is used in memory systems to improve manufacturing yield. In memory systems using a layer of cache memory for data transfer, redundancy logic adds additional complexity, requiring the cached data for defective cells in the main array to be routed correctly to the main array or a replacement array. Also, the cache memory is another source of defective cells. A defective cell in the cache memory can render a corresponding row or column of the main array unusable for cache based operations.

It is desirable to provide redundancy in cache based memory systems, which provides for correct data flow to and from the replacement array, and can address potential problems with defective cells in the cache memory.

SUMMARY

The present technology provides an integrated circuit including a memory, an array cache, and a cache replacement store. The memory includes a primary array and a redundant array. The integrated circuit also includes circuitry configured to transfer data into or out of the primary array using the array cache. For defective locations in the array cache, the circuitry is configured to use the cache replacement store in the transfer of data in place of the defective locations in the array cache, and map addresses in the primary array corresponding to the defective locations in the cache array to the redundant array.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
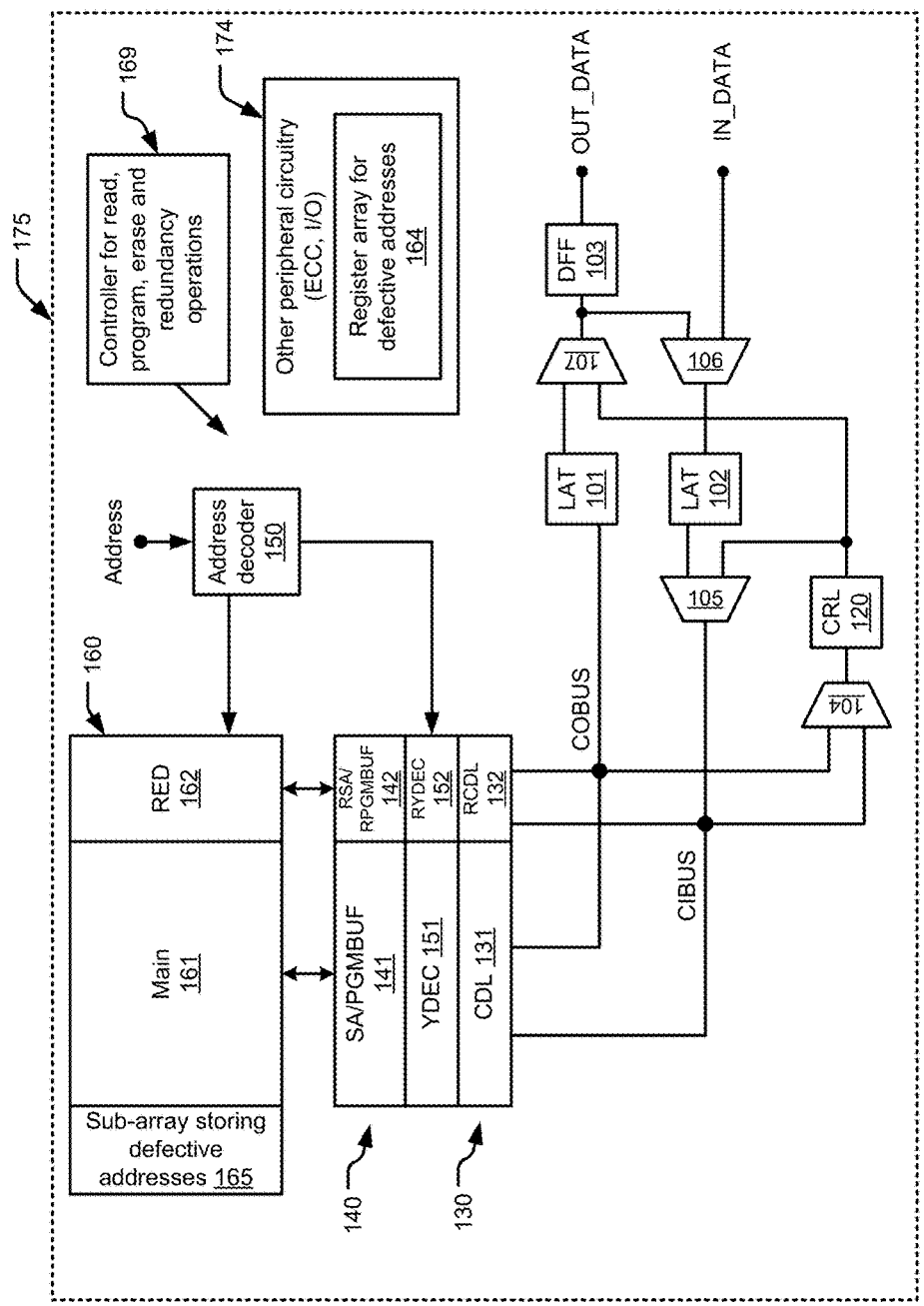
FIG. 1 is a block diagram of an integrated circuit including a memory.

FIG. 1 is a simplified block diagram of an integrated circuit 175 including a memory. In this example, the integrated circuit 175 includes an array 160 of memory cells. The array 160 can comprise a nonvolatile memory array of NAND flash memory cells, NOR flash memory cells, or memory cells based on other nonvolatile memory technologies. Also, the array 160 can comprise volatile memory cells, such as SRAM and DRAM cells.

The memory array 160 includes a primary array 161 (Main) of memory cells and a redundant array 162 (RED) of memory cells. The redundant array 162 can store data for defective sub-arrays in the primary array 161. A defective sub-array (e.g., a column, a row, a block, a byte, or any suitable size of sub-array for redundancy) contains one or more defective memory cells. A defective sub-array and its address in the primary array 161 are mapped to a redundant sub-array and a corresponding address in the redundant array 162. For example, a column address of a defective column in the primary array 161 is mapped to a column address of a redundant column in the redundant array 162. Data directed toward an address of a defective cell (e.g., an address of a defective sub-array) in the primary array 161 can be stored at a corresponding redundant address (e.g., an address of a corresponding redundant sub-array) in the redundant array 162.

The array 160 can also include a sub-array 165 storing addresses of defective sub-arrays in the primary array 161 and corresponding addresses of redundant sub-arrays in the redundant array 162, for use in redundancy mapping. Other data structures and circuits can be used for redundancy mapping as well.

An address decoder 150 is coupled to the array 160. Addresses can be supplied to or produced on the integrated circuit 175 and provided to the address decoder 150. The address decoder 150 can include word line decoders, bit line decoders, and other suitable decoders that decode the supplied addresses and select corresponding memory cells in the array 160.

Bit lines in the array 160 are coupled to a page buffer 140. The page buffer 140 can include a sense amplifier (SA) and one or more storage elements such as program buffers (PGMBUF) or latches for each bit line connected. The address decoder 150 can select and couple specific data in the array cache 130 via connecting bus lines to peripheral circuitry outside the page buffer 140. The page buffer 140 can store data that is written to or read from these specific memory cells.

In this example, the page buffer 140 includes a page buffer 141 (SA/PGMBUF) coupled to the primary array 161 through respective connecting bit lines, and a redundant buffer 142 (RSA/RPGMBUF) coupled to the redundant array 162 through respective connecting bit lines.

The page width of the primary array 161 is the number of bits to or from the primary array 161 that can be stored in parallel in the corresponding page buffer 141. For example, the page width of the primary array 161 can be four kilobytes. The page width of the redundant array 162 is the number of bits to or from the redundant array 162 that can be stored in parallel in the redundant buffer 142. For example, the page width of the redundant array 162 can be 16 to 32 bytes.

Peripheral circuitry in the integrated circuit 175 includes logic circuits or analog circuits that are not part of the array 160, such as the address decoder 150, the controller 169, and so on. In this example, the block 174 labeled "other peripheral circuitry" can include input-output (I/O) circuits, voltage generation circuits, and other circuit components on the integrated circuit 175, such as a general purpose processor or special-purpose application circuitry, or a combination of modules providing system-on-a-chip functionality supported by the array 160.

The integrated circuit 175 can interface with a host system accessing the integrated circuit 175 based on a suitable interface protocol. For example, the integrated circuit 175 can interface with a host system using Serial Peripheral Interface bus (SPI) connections.

The controller 169, implemented for example as a state machine, provides signals to control other circuits of the integrated circuit 175 to carry out the various operations described herein. These operations can include for a flash memory, program operations, erase operations, read operations, and redundancy operations.

The controller 169 can be implemented using special-purpose logic circuitry as known in the art. In other embodiments, the controller comprises a general purpose processor, which may be implemented on the same integrated circuit 175, which executes a computer program to control the operations of the device. In yet other embodiments, a combination of special purpose logic circuitry and a general purpose processor may be utilized for implementation of the controller.

Addresses of defective cells in the primary array 161 and corresponding addresses of redundant cells (i.e., corresponding redundant addresses) in the redundant array 162 can be determined and stored in the sub-array 165 during manufacturing of the integrated circuit 175. In another example, the controller 169 and other components of the integrated circuit 175 can perform tests, and determine and store addresses of defective cells in the primary array 161 and corresponding addresses of redundant cells in the redundant array 162 into the sub-array 165.

During a power-up event of the integrated circuit 175, the controller 169 copies addresses of defective cells in the primary array 161 and corresponding redundant addresses in the redundant array 162 stored in the sub-array 165 to a register array 164. In this way, the addresses of defective cells and corresponding redundant addresses can be saved in the nonvolatile memory array 160 when power is not supplied to the integrated circuit 175, and can be more readily available for redundant operations when the integrated circuit 175 is powered.

Data is transferred into or out of the primary array 161 and the redundant array 162 by using an array cache 130. The array cache 130 includes a first cache 131 (cache data latch or CDL) and a second cache 132 (redundant cache data latch or RCDL).

The first cache 131 (CDL) includes storage elements (e.g., latches) that are coupled in parallel to the primary array 161 via the page buffer 141. The first cache 131 (CDL) can have the same width as the page width of the primary array 161. In this example, each storage element or bit in the first cache 131 (CDL) is coupled to a corresponding storage element in the page buffer 141. The second cache 132 (RCDL) includes storage elements (e.g., latches) that are coupled to the redundant array 162 via the redundant buffer 142. The second cache 132 (RCDL) can have the same width as the number of columns of the redundant array 162. In this example, each storage element or bit in the second cache 132 (RCDL) is coupled to a corresponding storage element in the redundant buffer 142. The cache array 130 may contain one or more defective locations (defective bits or storage elements). A defective location in the cache array 130 may cause data loss. For example, data for a column in the primary array 161 corresponding to a defective location in the cache array 130 may not be properly programmed into (or read from) the corresponding column or a redundant column (if the corresponding column is defective).

To repair a defective location in the cache array 130 and provide redundancy for the defective location during data transfer into or out of the primary array 161, a cache replacement store 120 (cache repair latch or CRL) is used to store data in place of the defective location in the cache array 130. The cache replacement store 120 can have a lower defect rate (e.g., with looser design rules) such that a bit in the cache replacement store 120 is less likely to be defective than a bit in the cache array 130.

A defective location in the cache array 130 is mapped to a redundant address in the redundant array 162. Since data for a sub-array in the primary array 161 corresponding to the defective location in the array cache 130 cannot be read or programmed reliably through the defective location in the array cache 130, the sub-array in the primary array 161 is also mapped to the redundant address in the redundant array 162. For example, a column address of a column in the primary array 161 corresponding to a defective location in the cache array 130 can be mapped to a redundant column address of a redundant column in the redundant array 162. In this way, data directed toward an address of a sub-array in the primary array 161 corresponding to a defective location in the first cache 131 is stored in a corresponding address of a redundant sub-array in the redundant array 162, regardless of whether the corresponding sub-array in the primary array 161 is defective.

Similar to addresses of defective cells in the primary array 161 and corresponding redundant addresses in the redundant array 162, defective locations in the first cache 131 (CDL) and addresses of corresponding sub-arrays in the primary array 161, and corresponding redundant addresses in the redundant array 162 can be stored in the sub-array 165, and copied to the register array 164 during a power-up event of the integrated circuit 175.

A data bus provides data paths between the first cache CDL 131, the second cache RCDL 132, the cache replacement store CRL 120, and the input/output circuits of the integrated circuit 175. The data bus includes CDL input bus (CIBUS), CDL output bus (COBUS), data paths between data storage elements latch 101, latch 102, D flip-flop 103, multiplexers 104, 105, 106, and 107, and data paths to and from the input/output circuits of the integrated circuit 175 (IN_DATA, OUT_DATA). The data storage elements latch 101, latch 102, and D flip-flop 103 can be synchronized with a clock signal within the integrated circuit 175.

The multiplexers 104, 105, 106, and 107 are controlled by the controller 169 to direct data flows between the first cache CDL 131, the second cache RCDL 132, the cache replacement store CRL 120, and the input/output circuits of the integrated circuit 175.

The data bus is a parallel bus with a bus width equal to a data word or smaller. For example, the width of the data bus can be one byte, two bytes or four bytes. The data storage elements latch 101, latch 102, and D flip-flop 103, and the cache replacement store CRL 120 can each store one byte, two bytes or four bytes of data.

With the bus system, the integrated circuit 175 (e.g., the controller 169, the address decoder 150, and other components of the integrated circuit 175) uses the array cache 130 for program operations transferring data into the primary array 161, and for read operations transferring data out of the primary array 161. The integrated circuit 175 also uses the cache replacement store 120 (CRL) in place of defective locations in the array cache 130.

For a program operation transferring input data into the primary array 161, the input data is loaded into the first cache 131. If a memory cell at a corresponding address in the primary array 161 is mapped to the redundant array 162, then the input data for the memory cell is also loaded into the second cache 132. In addition, if a particular memory cell at a corresponding address in the array cache 130 is defective, the input data for the particular memory cell is loaded into the cache replacement store 120. And if the particular memory cell is mapped to the redundant array 162, the input data held in the cache replacement store 120 is then loaded into the second cache 132. The entire page of data, including input data held in the first cache 131 and redundant data held in the second cache 132, is then transferred respectively into the primary array 161 and the redundant array 162. Further details of a program operation are discussed below in connection with FIGS. 2A-2D.

For a read operation transferring output data from the primary array 161, an entire data page, including output data stored in the primary array 161 and redundant data stored in the redundant array 162, is read from the primary array 161 and the redundant array 162 into the first cache 131 and the second cache 132, respectively. If a memory cell at a corresponding address in the primary array 161 is defective, the redundant data is moved from the second cache 132 to the first cache 131. If a particular memory cell at a corresponding address in the first cache 131 is defective, the redundant data is moved from the second cache 132 to the cache replacement store 120. Then the output data is moved to the output circuits of the integrated circuit 175 from the first cache 131, or from the cache replacement store 120 if the particular cell at the corresponding address in the array cache 130 is defective. Further details of a read operation are discussed below in connection with FIGS. 3A-3D.

FIGS. 2A-2D illustrate an example data flow of a program operation. The data flow can be directed by the multiplexers controlled by the controller 169.

In this example, input data (for the integrated circuit 175) is loaded into the primary array 161 using the array cache 130. The controller 169 determines memory cells in the primary array 161 that are designated to store the input data, and determines corresponding locations in the first cache 131 (CDL) for holding the input data.

The controller 169 accesses the register array 164 and determines whether a memory cell in the primary array 161 designated to store the input data corresponds to an address of a defective cell mapped to a first redundant address in the redundant array 162 (i.e., the memory cell is part of a defective sub-array including the address of a defective cell). And the controller 169 determines a corresponding location in the second cache 132 (RCDL) corresponding to the first redundant address in the redundant array 162.

The controller 169 also accesses the register array 164 and determines whether a particular location in the first cache 131 for holding the input data is defective and is mapped to a second redundant address in the redundant array 162. And the controller 169 determines a corresponding location in the second cache 132 (RCDL) for the second redundant address in the redundant array 162.

Figure 2A:
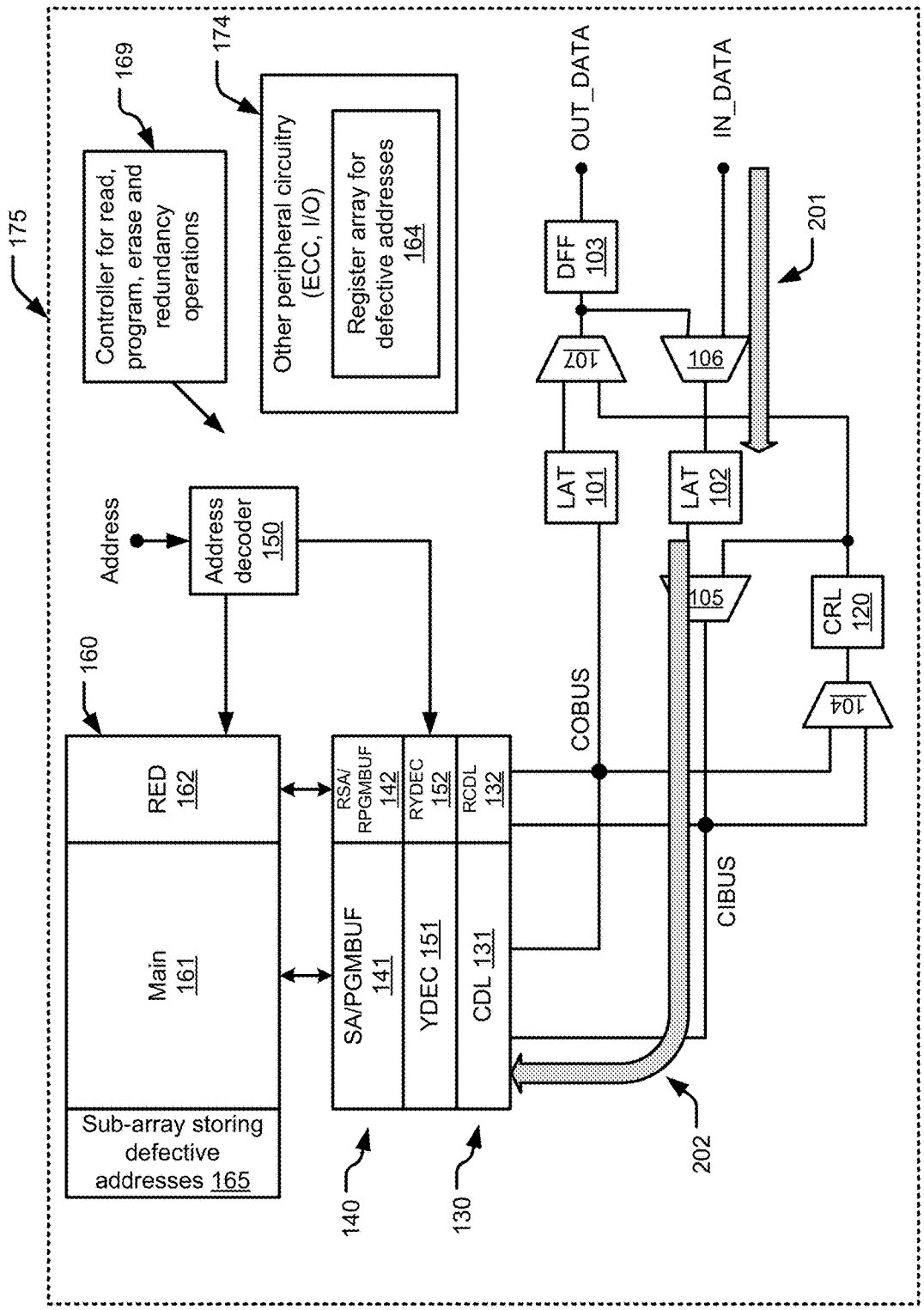
FIGS. 2A-2D illustrate an example data flow of a program operation.

As illustrated in FIG. 2A, the input data is loaded from the input circuits of the integrated circuit 175 (IN_DATA) into corresponding locations in the first cache 131 (CDL) via the multiplexer 106, the latch 102, the multiplexer 105 and CIBUS (arrows 201 and 202).

Figure 2B:
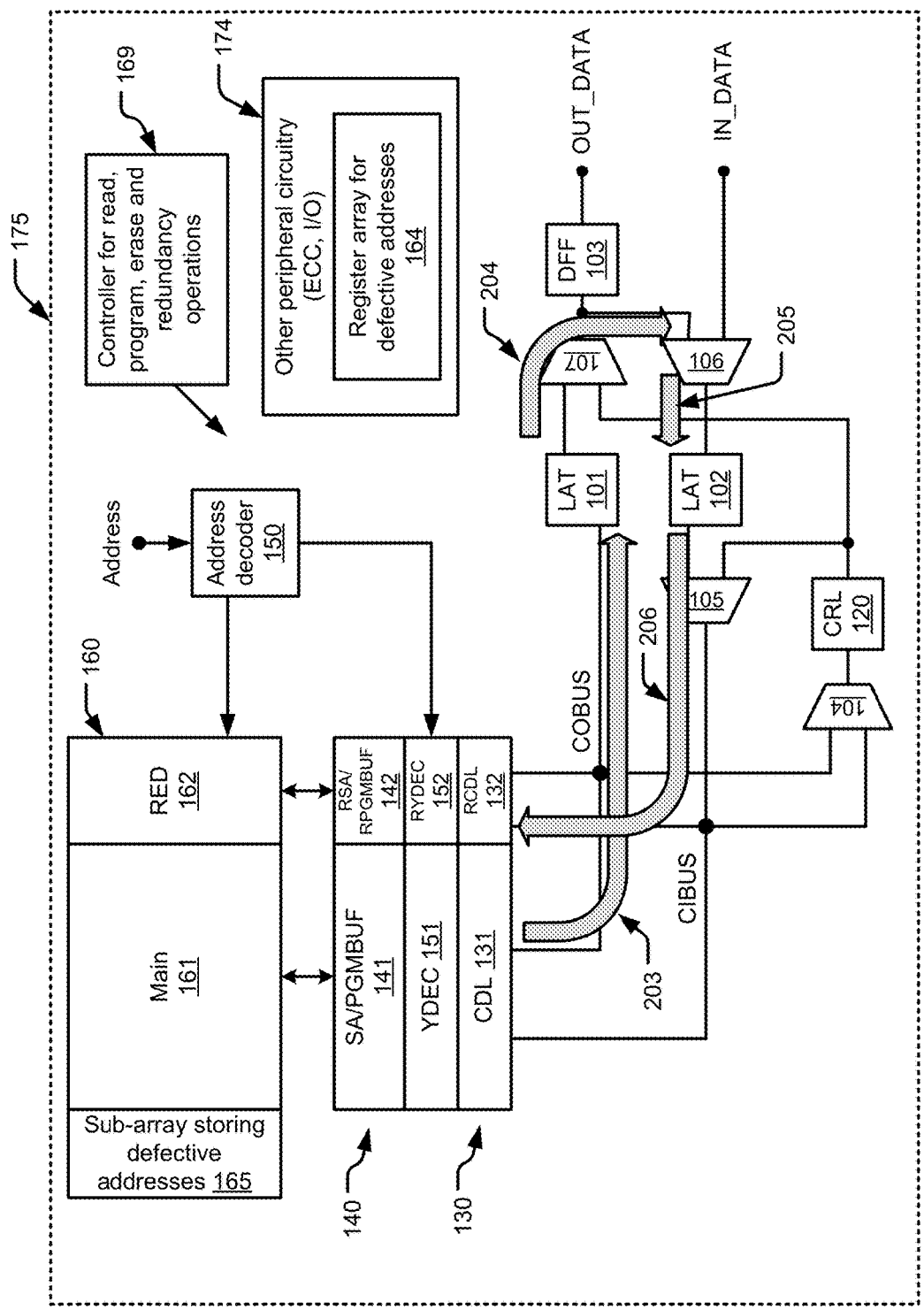

If a particular location in the first cache 131 (CDL) for holding the input data corresponds to an address of a defective cell in the primary array 161 that is mapped to a first redundant address in the redundant array 162, the input data held at the particular location is transferred to the second cache 132 (RCDL) at a location corresponding to the first redundant address in the redundant array 162. As illustrated in FIG. 2B, the input data held at the particular location in the first cache 131 (CDL) is first loaded into the latch 101 via COBUS (arrow 203). The data is then loaded into the latch 102 via the multiplexers 107 and 106 (arrows 204 and 205), and loaded via the multiplexer 105 and CIBUS (arrow 206) into the second cache 132 (RCDL).

Figure 2C:
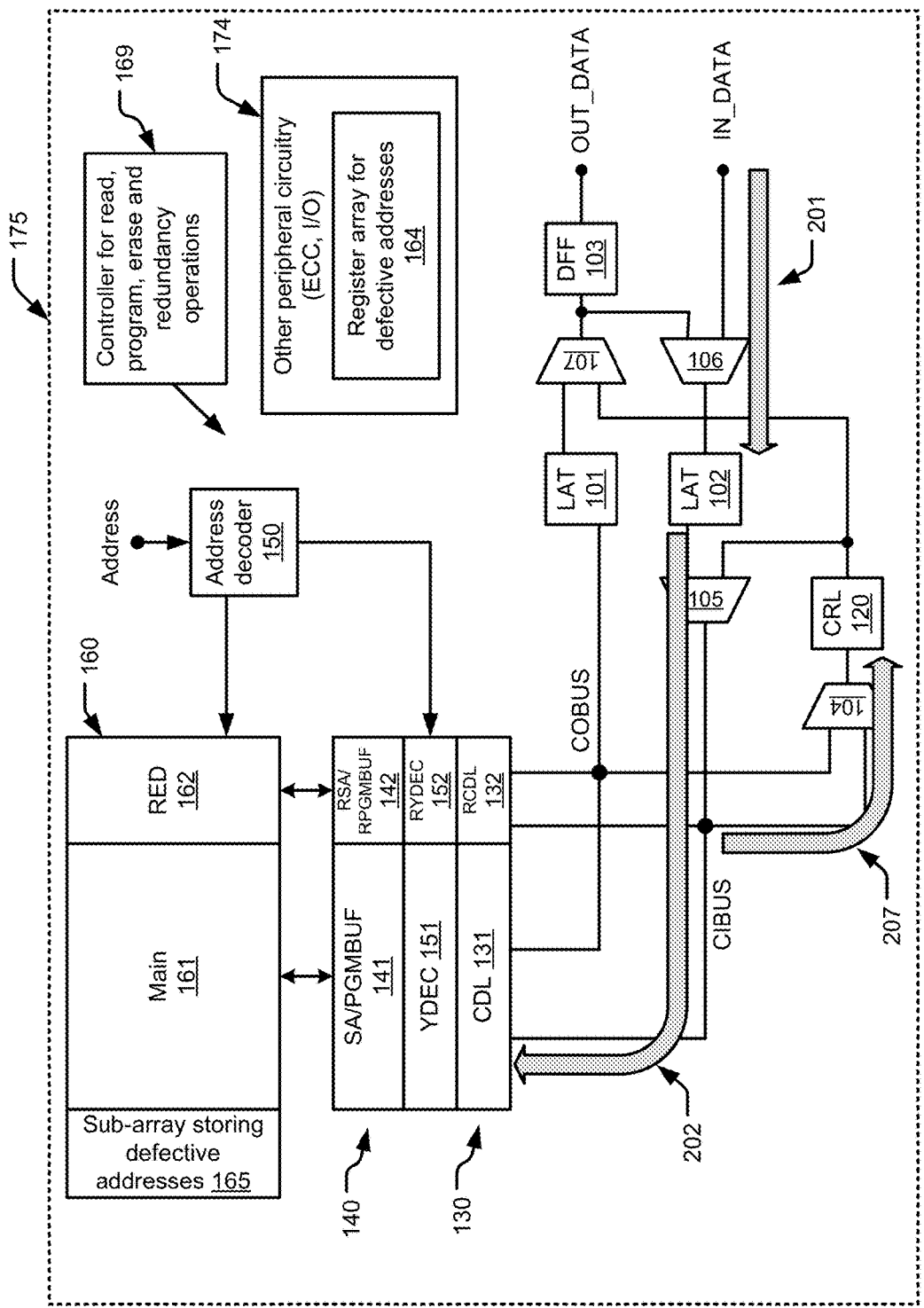
Figure 2D:
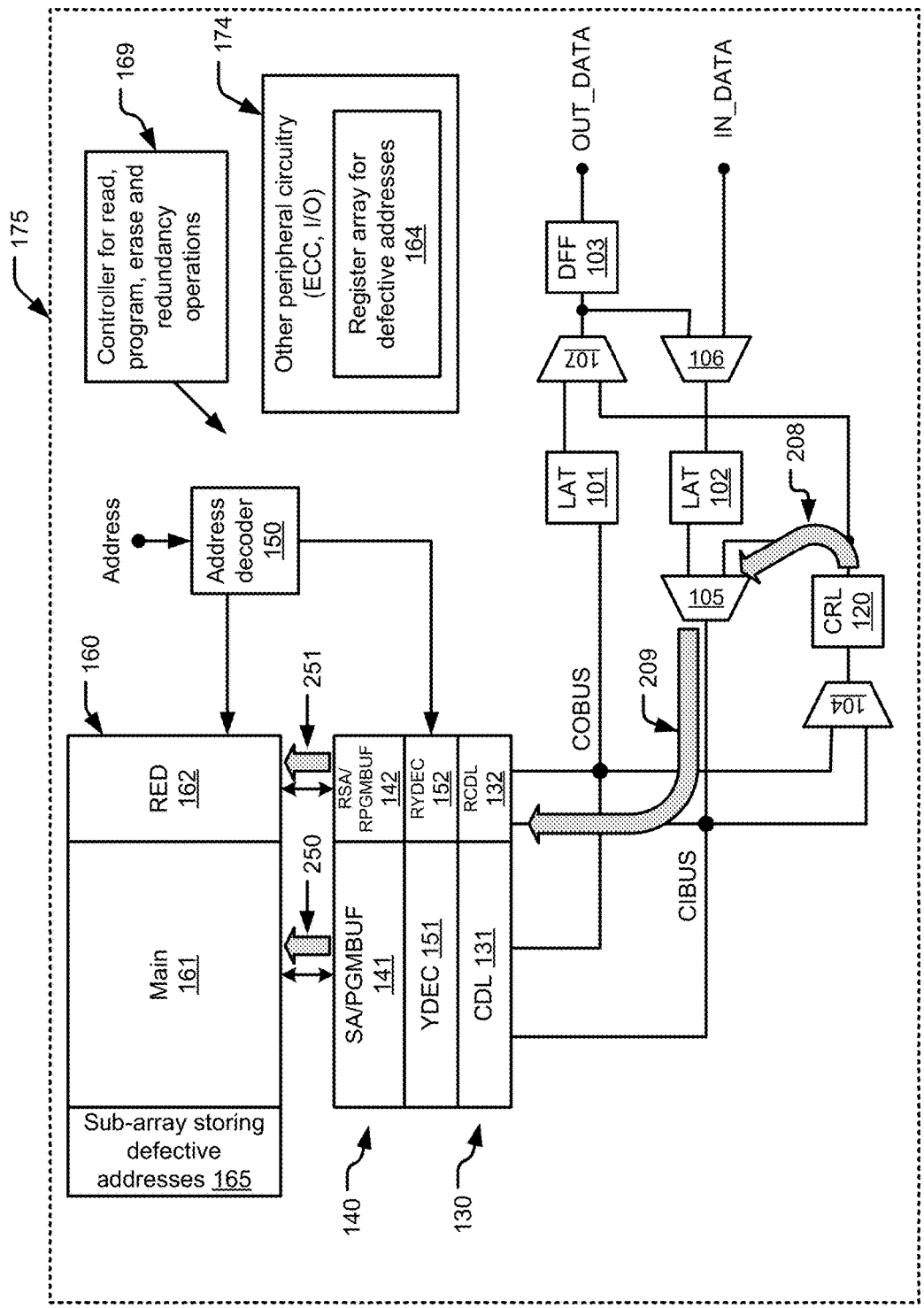

As illustrated in FIG. 2C, if a particular location in the first cache 131 (CDL) intended to hold the input data is defective and is mapped to a second redundant address in the redundant array 162, the input data for the particular location is loaded into the cache replacement store 120 (CRL) via the multiplexer 104 (arrow 207), in addition to being loaded into the particular location in the first cache 131 (CDL) (arrows 201 and 202). As illustrated in FIG. 2D, the input data held at the cache replacement store 120 (CRL) is then loaded via the multiplexer 105 and CIBUS (arrows 208 and 209), into the second cache 132 (RCDL) at a location corresponding to the second redundant address in the redundant array 162. Here, input data for the second redundant address in the redundant array 162 is not copied from its corresponding location in the first cache 131 (CDL) as the corresponding location is defective.

In this example, the input data can be loaded into the first cache 131 and the second cache 132 one data word (e.g., one byte or two bytes) at a time through the bus system. After an entire data page or a portion of a data page (for the primary array 161) of the input data is loaded, the input data held in the first cache 131 (CDL) and the redundant data held in the second cache 132 (RCDL) are then loaded into the primary array 161 and the redundant array 162 via the page buffer 141 and the redundant buffer 142, respectively (arrows 250 and 251).

FIGS. 3A-3D illustrate an example data flow of a read operation. The data flow can be directed by the multiplexers controlled by the controller 169.

In this example, output data for the integrated circuit 175 is read from the primary array using the array cache 130. The controller 169 determines memory cells in the primary array 161 that are designated to store the output data, and determines corresponding locations in the first cache 131 (CDL). The controller 169 accesses the register array 164 and determines whether one or more of these memory cells correspond to one or more addresses of defective cells mapped to first redundant addresses in the redundant array 162. As described above with the program operation, redundant data for these memory cells is stored at the first redundant addresses in the redundant array 162. The controller 169 also determines locations in the second cache 132 (RCDL) corresponding to the first redundant addresses.

In addition, the controller 169 accesses the register array 164 and determines whether one or more locations in the first cache 131 (CDL) corresponding to memory cells designated to store the output data are defective and mapped to second redundant addresses in the redundant array 162.

Figure 3A:
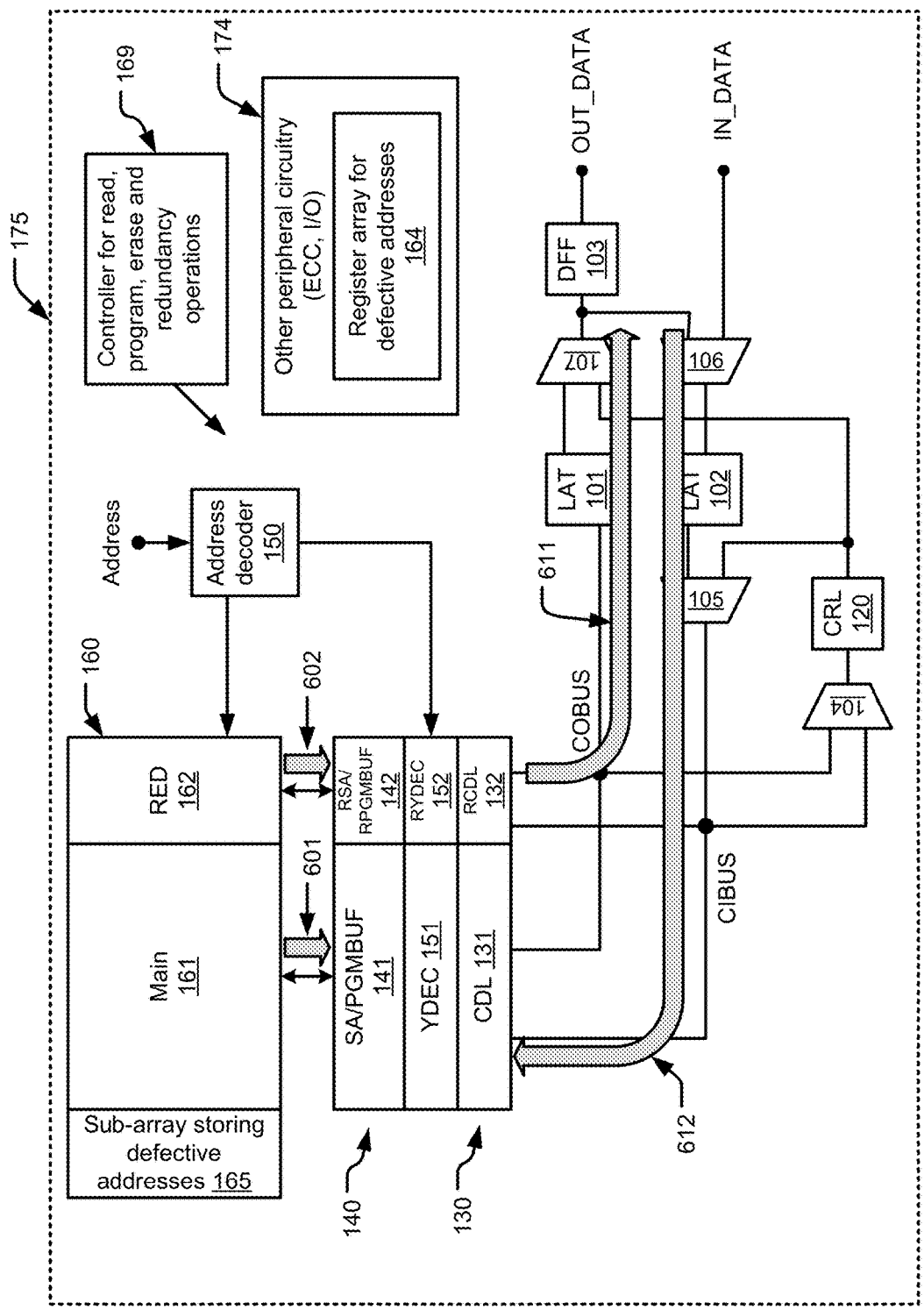
FIGS. 3A-3D illustrate an example data flow of a read operation.
Figure 3B:
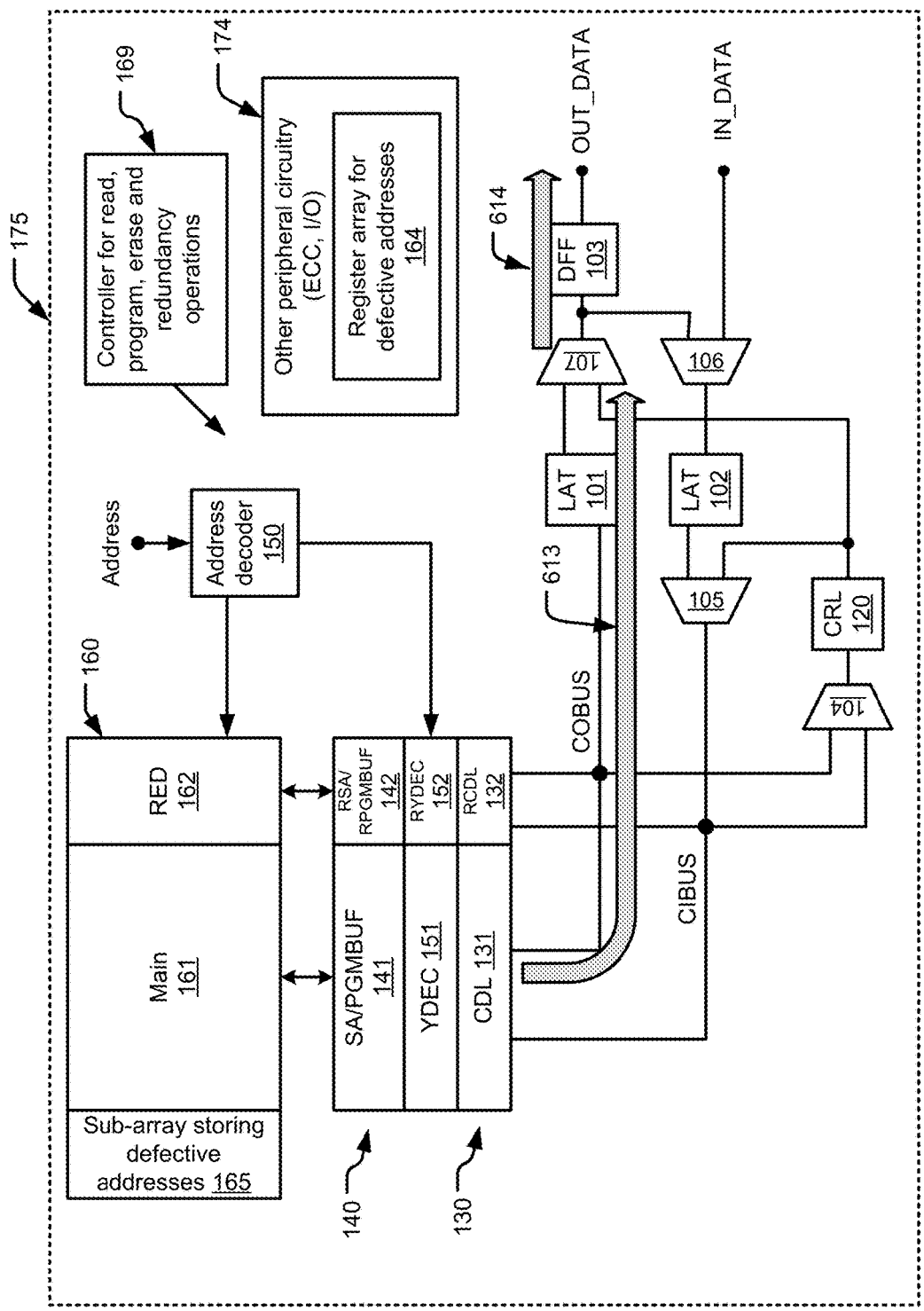

As illustrated in FIG. 3A, an entire data page of the output data is read from the primary array 161 and the redundant array 162 into the first cache 131 (CDL) and the second cache 132 (RCDL) via the page buffer 141 and the redundant buffer 142, respectively (arrows 601 and 602). The redundant data held in the second cache 132 (RCDL) read from the first redundant addresses in the redundant array 162 is then moved from the second cache 132 (RCDL) to corresponding locations in the first cache 131 (CDL) via COBUS, the latch 101, the multiplexers 107, 106, the latch 102, the multiplexer 105, and CIBUS (arrows 611 and 612). As illustrated in FIG. 3B, the output data then is moved (e.g., a data word at a time) from the first cache 131 (CDL) toward output circuits of the integrated circuit 175 (OUT_DATA), via COBUS, the latch 101, multiplexer 107, and D flip-flop 103 (arrows 613 and 614).

Figure 3C:
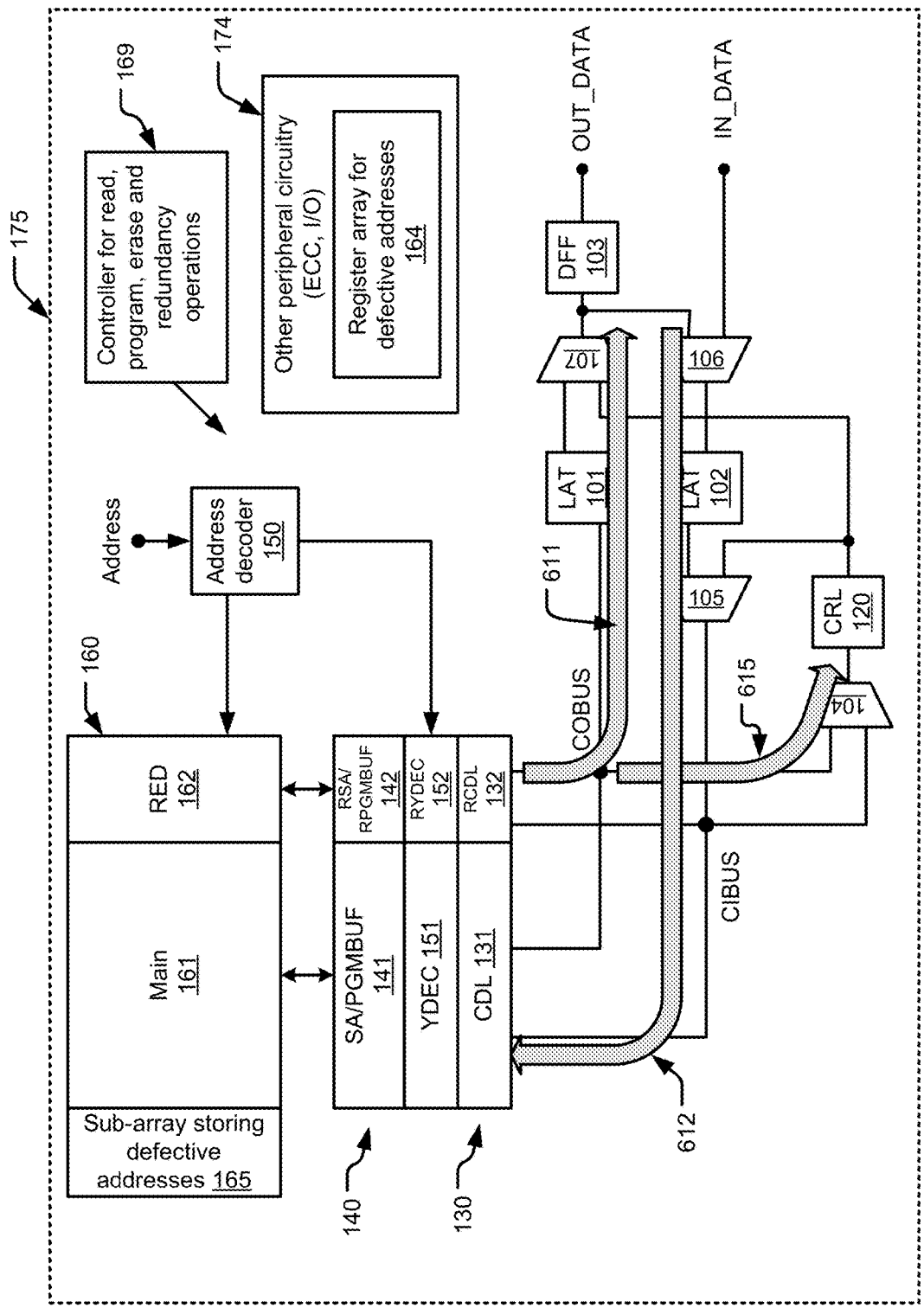
Figure 3D:
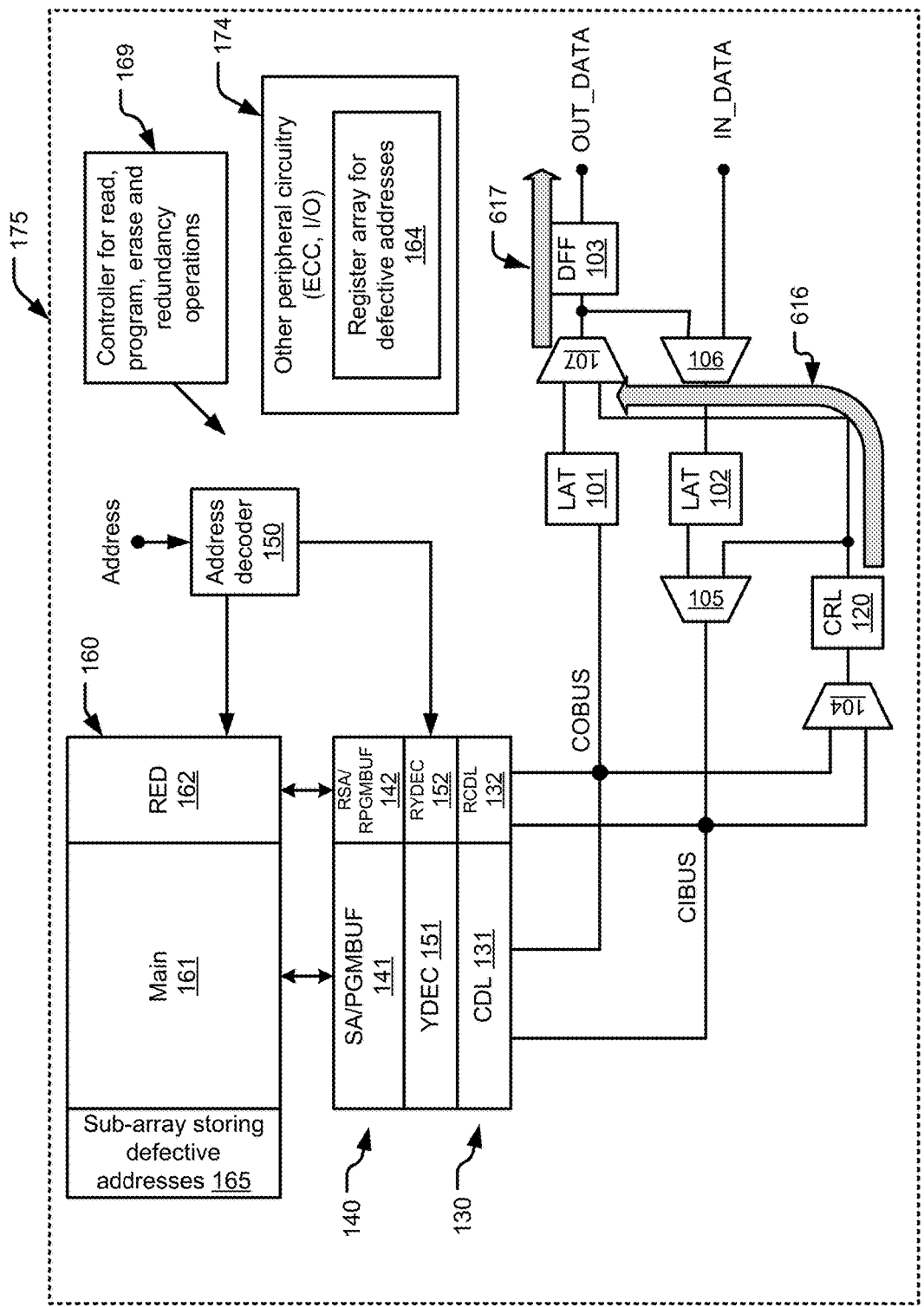

As illustrated in FIG. 3C, if a particular location in the first cache 131 (CDL) holding the output data is defective and is mapped to a second redundant address in the redundant array 162, the output data for the particular location is loaded into the cache replacement store 120 (CRL) via COBUS and the multiplexer 104 (arrow 615), in addition to being loaded into the first cache 131 (CDL) via COBUS, latch 101, multiplexers 107 and 106, latch 102, multiplexer 105, and CIBUS (arrows 611 and 612). As illustrated in FIG. 3D, the output data held at the cache replacement store 120 (CRL) for defective locations in the first cache 131 (CDL) is then moved toward the output circuits of the integrated circuit 175 (OUT_DATA), via multiplexer 107, and D flip-flop 103 (arrows 616 and 617). Note that data at defective locations in the first cache 131 (CDL) is not provided toward the output circuits of the integrated circuit 175 (OUT_DATA).

Figure 4:
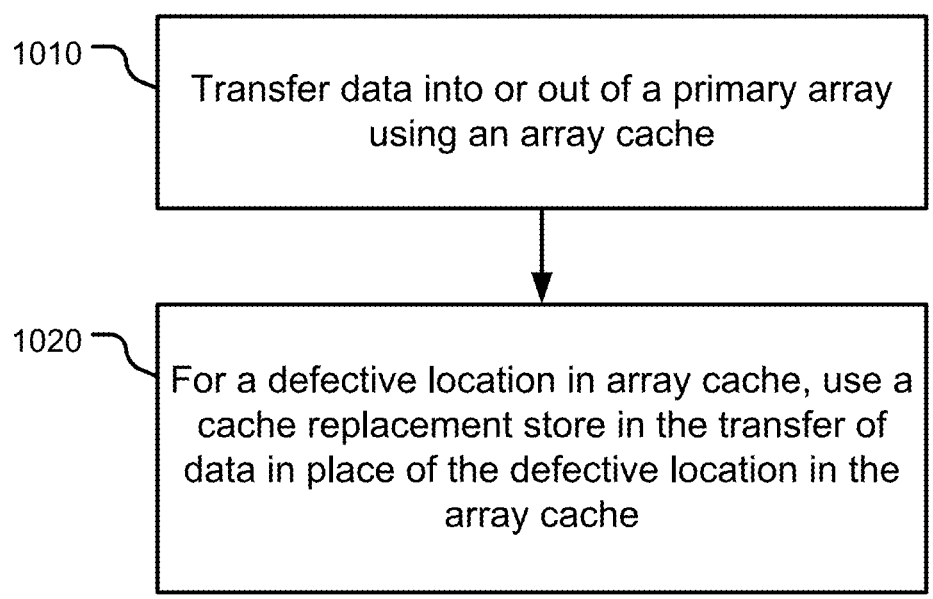
FIG. 4 is a flow chart of a method for accessing a memory.

FIG. 4 is a flow chart of a method for accessing a memory such as the memory array 160 of the integrated circuit 175, as illustrated with FIG. 1. The method of FIG. 4 can be implemented by the controller 169, the address decoder 150, and other components of the integrated circuit 175.

The method of FIG. 4 starts at Step 1010. At Step 1010, the controller 169 causes the input/output circuits of the integrated circuit 175 and the multiplexers 104, 105, 106, or 107 to transfer data into or out of the primary array 161 of the memory array 160, using the array cache 130.

As described herein, the controller 169 maps defective cells in the primary array 161 to the redundant array 162. For transferring data into the redundant array 162, the controller 169 loads data into the second cache 132 (RCDL) if a cell at a corresponding address in the primary array 161 is mapped to the redundant array 162.

At Step 1020, for a defective location in the array cache 130, the controller 169 uses the cache replacement store 120 (CRL) in the transfer of the data in place of the defective location in the array cache 130.

As described herein, for a program operation, the controller 169 maps addresses corresponding to defective cells in the primary array 161 to the redundant array 162 and addresses corresponding to defective cells in the array cache 130, to the redundant array. The controller 169 stores data in the cache replacement store 120 (CRL) if a cell at a corresponding address in the array cache 130 is defective. The controller 169 loads data from the cache replacement store 120 (CRL) into the second cache 132 (RCDL), if the cell at the corresponding address in the array cache 130 is mapped to the redundant array 162.

For a read operation, the controller 169 moves data from the second cache 132 (RCDL) to the first cache 131 (CDL) if a cell at a corresponding address in the primary array (161) is defective, and from the second cache 132 (RCDL) to the cache replacement store 120 (CRL) if a cell at a corresponding address in the first cache 131 (CDL) is defective. The controller 169 moves data to output circuits of the integrated circuit 175 from the first cache 131 (CDL) or, if the cell at the corresponding address in the array cache 130 is defective, from the cache replacement store 120 (CRL).

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit comprising:
   a memory including a primary array including a page buffer and a redundant array;
   an array cache;
   a cache replacement store; and
   circuitry configured to transfer data into or out of the primary array through the page buffer using the array cache, and for a defective location in the array cache, to use the cache replacement store in the transfer of the data in place of the defective location in the array cache, wherein the array cache includes a first cache coupled with the primary array, and a second cache coupled with the redundant array, and the circuitry is configured to:
   map addresses corresponding to defective cells in the primary array and addresses corresponding to defective cells in the array cache, to the redundant array;
   move data from the second cache to the first cache if a cell at a corresponding address in the primary array is defective, and from the second cache to the cache replacement store if a cell at a corresponding address in the first cache is defective; and
   move data to data output circuits from the first cache or, if the cell at the corresponding address in the array cache is defective, from the cache replacement store.

2. The integrated circuit of claim 1, wherein the first cache is coupled with the page buffer in the primary array and the circuitry is configured to:
   load data into the second cache if a cell at a corresponding address in the primary array is mapped to the redundant array, for transfer to the redundant array.

3. The integrated circuit of claim 1, wherein the circuitry is configured to:
   store data in the cache replacement store if a cell at a corresponding address in the array cache is defective; and
   load data from the cache replacement store into the second cache, if the cell at the corresponding address in the array cache is mapped to the redundant array.

4. The integrated circuit of claim 1, further including:
   a data bus providing data paths connecting the first cache and the cache replacement store to data input and output circuits; and connecting the second cache and the cache replacement store to the first cache.

5. The integrated circuit of claim 4, wherein the first cache has a cache width equal to a data page in the page buffer in the primary array, and the data bus has a bus width equal to one data word or smaller.

6. The integrated circuit of claim 1, wherein the page buffer is between the first cache and the primary array, and including a redundant buffer between the second cache and the redundant array.

7. The integrated circuit of claim 1, wherein the circuitry is configured to map column addresses corresponding to columns including defective cells in the primary array and column addresses corresponding to defective cells in the array cache, to redundant columns in the redundant array.

8. A method for accessing a memory coupled to an array cache, the memory array including a primary array including a page buffer and a redundant array, the array cache including a first cache coupled with the page buffer in the primary array, and a second cache coupled with the redundant array, and configured to couple to a cache replacement store, the method comprising:
   mapping addresses corresponding to defective cells in the primary array and addresses corresponding to defective cells in the array cache, to the redundant array;
   transferring data into or out of the primary array through the page buffer using the array cache; and
   for a defective location in the array cache, using the cache replacement store in the transfer of the data in place of the defective location in the array cache; including:

moving data from the second cache to the first cache if a cell at a corresponding address in the primary array is defective, and from the second cache to the cache replacement store if a cell at a corresponding address in the first cache is defective; and moving data to data output circuits from the first cache or, if the cell at the corresponding address in the array cache is defective, from the cache replacement store.

9. The method of claim 8, further comprising:

loading data into the second cache if a cell at a corresponding address in the primary array is mapped to the redundant array, for transfer to the redundant array.

10. The method of claim 8, further comprising:

storing data in the cache replacement store if a cell at a corresponding address in the array cache is defective; and loading data from the cache replacement store into the second cache, if the cell at the corresponding address in the array cache is mapped to the redundant array.

11. The method of claim 8, further including:

a data bus providing data paths connecting the first cache and the cache replacement store to data input and output circuits; and connecting the second cache and the cache replacement store to the first cache.

12. The method of claim 11, wherein the first cache has a cache width equal to a data page of the page buffer in the primary array, and the data bus has a bus width equal to one data word or smaller.

13. The method of claim 8, further comprising mapping column addresses corresponding to columns including defective cells in the primary array and column addresses corresponding to defective cells in the array cache, to redundant columns in the redundant array.

14. A method for forming an integrated circuit, comprising:

forming a memory including a primary array including a page buffer and a redundant array;

forming an array cache;

forming a cache replacement store; and forming circuitry configured to transfer data into or out of the primary array through the page buffer using the array cache, and for a defective location in the array cache, to use the cache replacement store in the transfer of the data in place of the defective location in the array cache, wherein the array cache includes a first cache coupled with the primary array, and a second cache coupled with the redundant array, and the circuitry is configured to:

map addresses corresponding to defective cells in the primary array and addresses corresponding to defective cells in the array cache, to the redundant array;

move data from the second cache to the first cache if a cell at a corresponding address in the primary array is defective, and from the second cache to the cache replacement store if a cell at a corresponding address in the first cache is defective; and move data to data output circuits from the first cache or, if the cell at the corresponding address in the array cache is defective, from the cache replacement store.

\* \* \* \* \*